United States Patent [19]

Ayasli

[11] Patent Number: 4,760,350
[45] Date of Patent: Jul. 26, 1988

[54] INTERNALLY MATCHED POWER AMPLIFIER

[75] Inventor: Yalcin Ayasli, Lexington, Mass.

[73] Assignee: Hittite Microwave Corporation, Woburn, Mass.

[21] Appl. No.: 59,530

[22] Filed: Jun. 8, 1987

[51] Int. Cl.[4] .............................................. H03F 3/16
[52] U.S. Cl. .................................... 330/277; 330/286
[58] Field of Search ................... 330/53, 54, 277, 266, 330/311

[56] References Cited

U.S. PATENT DOCUMENTS 4,337,439 6/1982 Sosin ...................................... 330/54

Primary Examiner—Gene Wan
Attorney, Agent, or Firm—Joseph S. Iandiorio; Douglas E. Denninger

[57] ABSTRACT

An internally matched power amplifier including an input terminal for receiving an input signal and an output terminal; a plurality of semiconductor devices connected with the load electrodes in series; transmission means for coupling the load electrodes of neighboring devices in the series and establishing an internal impedance match; the last device in the series having its other electrode connected to the output terminal; the first device in the series having its control electrode connected to the input terminal and its other load electrode connected to a common conductor and having a predetermined d.c. bias level and a predetermined signal voltage level between its control and its other electrode; first means for setting the control means of each device but the first in the series to the predetermined signal voltage level and second means for biasing the control electrode of each device but the first in the series to the predetermined d.c. bias level.

14 Claims, 2 Drawing Sheets

INTERNALLY MATCHED POWER AMPLIFIER

FIELD OF INVENTION

This invention relates to an internally matched power amplifier, and more particularly to such a power amplifier in which the transistors are arranged in a series configuration.

BACKGROUND OF INVENTION

When it is necessary to increase the power output of a power amplifier, a conventional approach is to add more amplifications stages, or transistors, in parallel. This is particularly a problem in solid state amplifiers at microwave frequencies commonly achieved through GaAs field effect transistors (FETs). For example, for a typical 12 mm S-band power device with gate widths of 300 $\mu$m, four individual FET amplification stages or cells may be needed to be paralleled to provide the proper output power. There are a number of shortcomings associated with such increased paralleling, which is particularly critical in the microwave range. Paralleling increases the transverse dimension of the overall amplifier, and as this dimension becomes a significant fraction of the wavelength at the frequency of interest, all of the stages cannot be excited in phase. This out of phase combination of signals through the various stages or transistors results in an overall gain reduction. Paralleling also reduces both the input and the output impedances, so that matching to the outside circuits with the available circuit elements may not be possible over the desired band width. Thus the requirement of presenting proper complex impedances to the outside devices for maximum power transfer can only be satisfied at a very narrow band of frequencies. This results in reduced band width and increased sensitivity to device and circuit parameters, and even if impedance matching is accomplished at these low impedance levels, circuit losses in the tuning elements become significant and reduce the power output and efficiency of the amplifier. Another shortcoming of paralleling transistors is that the grounding inductances become significant in comparison to reduced internal resistances and introduces a series feedback path which creates instability in larger devices, that is, those with large numbers of parallel transistors.

One of the primary problems with paralleling stages or transistors to increase power output is that it demands a proportionate increase in the d.c. current that needs to be supplied to the amplifier. In thin film circuitry used for monolithic microwave integrated circuit (MMIC) chips, components must then carry current at or above the electromigration current density, and this introduces serious long-term reliability problems. In addition, in a circuit in which packing density is high, the distribution of the required amperes of current to each module is a significant problem in itself.

These shortcomings seriously limit the maximum power output of any amplifier, and especially that from large periphery FET circuits.

There are additional problems in wide-band applications using traveling wave amplifier approaches, such as the increased loading on the gate and drain lines and the maximum allowable drain voltage swing that sets an upper limit to the usable total periphery per amplifier stage.

SUMMARY OF INVENTION

It is a further object of this invention to provide an improved internally matched power amplifier.

It is a further object of this invention to provide such an internally matched power amplifier in which the stages are effectively "series" connected.

It is a further object of this invention to provide such an internally matched power amplifier which maintains its input impedance independent of the number of stages and increases its output impedance as a function of the number of stages.

It is a further object of this invention to provide such an internally matched power amplifier which maintains the phase through all stages.

It is a further object of this invention to provide such an internally matched power amplifier in which the impedance levels of the stages are maintained significantly greater than the grounding inductances and stability is maintained.

It is a further object of this invention to provide such an internally matched power amplifier in which the power is increased through increased voltage, not current, and current distribution problems are avoided.

It is a further object of this invention to provide such an internally matched power amplifier in which the terminal voltages and impedances add while operating at the same current level.

It is a further object of this invention to provide such an internally matched power amplifier in which the signal power is added along the direction of signal propagation.

It is a further object of this invention to provide such an internally matched power amplifier which operates at low fixed current.

It is a further object of this invention to provide such an internally matched power amplifier which avoids the need for extensive input/output impedance matching circuitry.

It is a further object of this invention to provide such an internally matched power amplifier which is particularly advantageous for high-impedance, high operating voltage power amplifiers, especially those utilizing monolithic FETs and especially in microwave ranges.

The invention results from the realization that a truly improved internally matched power amplifier with improved operating characteristics and increased input and output impedance can be effected for wide application, and especially in the area of high-impedance/high-operating voltage monolithic power FETs by connecting effectively in series two or more semiconductor devices coupled by inductances and biased so that each of the transistors has the same signal voltage level and the same d.c. bias level on its control electrode.

This invention features an internally matched power amplifier. There is an input terminal for receiving an input signal and an output terminal. A plurality of semiconductor devices are connected with the load electrodes in series. Transmission means couple the load electrodes of neighboring devices in the series and establish an internal impedance match over a wide range of frequencies. The last device in the series has its other electrode connected to the output terminal. The first device in the series has its control electrode connected to the input terminal and its other load electrode connected to a common conductor. There is a predetermined d.c. bias level and a predetermined signal voltage level between its control and its other load electrode.

There are first means for setting the control means of each device but the first in the series to the predetermined signal voltage level and second means for biasing the control electrode of each device but the first in the series to the predetermined d.c. bias level.

In preferred embodiments, the output terminal may be adapted for connection to a d.c. power source. The first means for setting the control electrode to a predetermined signal voltage level may include capacitor means coupled between the control electrode and the common conductor of each of the devices other than the first in the series, and the second means for biasing may include a voltage divider means coupled between the output terminal and the common conductor and connected with the control electrode of each of the devices in the series other than the first one. There may be one input stage and a plurality of output stages constituted by the series-connected semiconductor devices, or there may be simply one input stage and one output stage each including a single semiconductor device. The semiconductor devices are typically transistors, and more typically FETs, wherein the load terminals are the source and drain and the control electrode is a gate. Preferably all of the transistors used in the various stages are identical or as similar as possible. The transmission means may be a transmission line, a transmission line section, or an inductance.

DISCLOSURE OF PREFERRED EMBODIMENT

Other objects, features and advantages will occur from the following description of a preferred embodiment and the accompanying drawings, in which.

Figure 1:
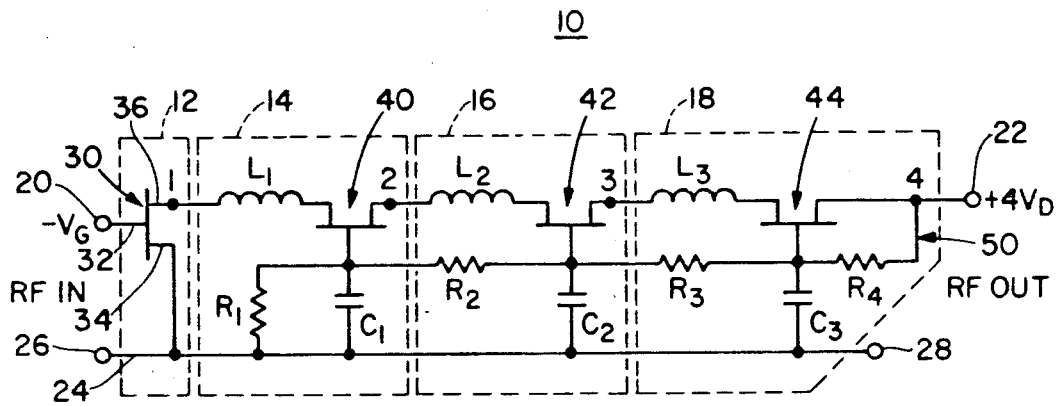
FIG. 1 is a schematic of an four-stage internally matched power amplifier according to this invention.

There is shown in FIG. 1 an internally matched power amplifier 10 according to this invention including four stages 12, 14, 16 and 18. There is an input terminal 20 which receives the bias voltage $-V_G$ and an output terminal 22 where can be applied a d.c. bias voltage $+4V_D$. A common conductor 24 includes terminals 26 and 28. The input signal is presented across terminals 20, 26; the amplified output signal appears across terminals 22 and 28. The first, or input, stage 12 includes a semiconductor device 30 such as an FET transistor, which has its control electrode or gate 32 connected to input terminal 20. Its load electrodes are connected one to common conductor 24, the other to an inductance $L_1$ in stage 14. In this instance, since transistor 30 is an FET, first load electrode 34 is referred to as the source, and the second load electrode 36 is referred to as the drain. In addition to the first or input stage 12 there are one or more output stages as indicated by stages 14, 16 and 18. Each stage includes a transistor 40, 42, 44, and transmission medium, inductance $L_1$, $L_2$ and $L_3$ which are interconnected between the load skewed electrodes of neighboring transistors and a capacitance $C_1$, $C_2$ and $C_3$, which is connected between the control electrode or gate of each of the transistors and the common conductor 24. The inductances are just one form of transmission medium that can be used; conventional transmission lines or transmission line sections are used in practical implementations for establishing an internal impedance match over a wide range of frequencies, i.e., d.c. to the maximum operating frequency of the available transistors. Presently transistors operate as high as 100 gHz. The capacitance is not required to be lumped capacitors as $C_1$, $C_2$ and $C_3$ but may as well be the internal capacitance of a semiconductor device such as a diode or transistor. In the latter case it allows for control or modulation of the amplified signal. There is also a voltage divider network 50 including resistors $R_1$, $R_2$, $R_3$ and $R_4$ which are coupled between the output terminal 22, where the d.c. supply voltage $+4V_D$ appears, and the common conductor 24, with connections made at each of the gates of the transistors. The second load electrode or drain of the last transistor 44 in the series is connected directly to output terminal 22. The reactive circuit elements $L_1$, $L_2$, $L_3$ and $C_1$, $C_2$, $C_3$ are chosen so that they form together with the transistors an artificial transmission line with increasing characteristic impedance as the signal travels from input to output. This permits each transistor to receive the optimum AC load line, but at the same time all transistors add their output impedance so that the output impedance of this four-stage amplifier is four times that of a similar single-stage amplifier. The gate 32 of the first transistor 30 is biased with a small negative voltage $-V_G$, so that it operates at one half the drain current $I_{dss}$, and the output drain electrode of transistor 44 at terminal 22 is biased for four times the normal drain voltage of a single transistor. No other external biases are required. The voltage divider network which connects the drain of the last transistor 44 to all the gate terminals biases the gate electrodes of all of the output stage transistors, also at $\frac{1}{2} I_{dss}$, the same as the base of skewed transistor 30 at input stage 12. Biasing depends only on the relative values of $R_1$, $R_2$, $R_3$ and $R_4$, and it therefore insensitive to variations in absolute resistor values. Capacitors $C_1$, $C_2$ and $C_3$ are chosen so that the signal voltage level on the gate of each of their associated transistors 40, 42 and 44 is the same as the signal voltage on the gate 32 of the first transistor 30 in input stage 12. Inductors $L_1$, $L_2$ and $L_3$ are chosen so that they tune out the capacitive reactances.

The choice of the inductances and capacitances depends only on the internal parameters of the transistors used, and so this choice is independent of the operating frequency and the details of the external circuitry at the input or the output. This means that once the power amplifier according to this invention is optimized and fabricated it can be treated just like any equivalent FET circuit but with higher gain, larger input/output impedance, and larger output voltage and power capability. The composite FET can then be used in any application where a regular FET would normally be used.

Figure 2:
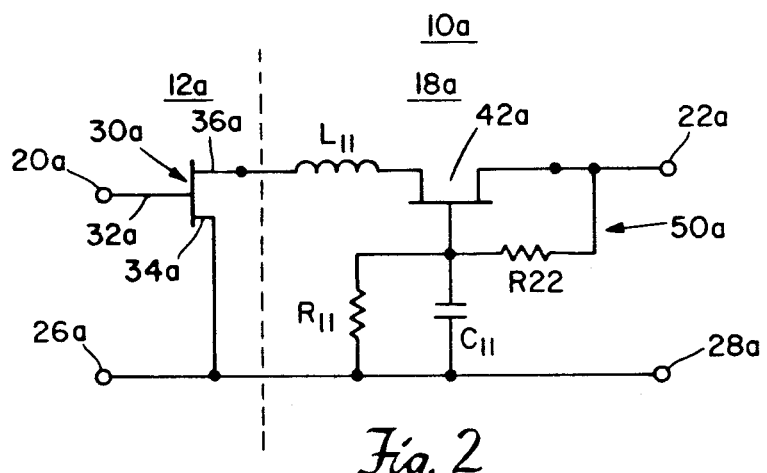
FIG. 2 is a schematic of a two-stage internally matched power amplifier according to this invention.

Although the circuit thus far described includes the input stage and three output stages, any number of output stages may be used in accordance with this invention, more or less. For example, the smallest power amplifier 10a, FIG. 2, includes the input stage 12a and a single output stage 18a which includes a single transistor 42a, single inductor $L_{11}$, a single capacitor $C_{11}$, and voltage divider 50a, which includes but two resistors $R_{11}$ and $R_{22}$. The same effect occurs here as with the multiple output stage configuration of FIG. 1, with the exception that the power amplification is less. The inductance $L_{11}$ provides the unique transmission characteristics while capacitor $C_{11}$ and voltage divider 50a provide the signal voltage level and d.c. bias level at the gate of transistor 42a to match the same conditions at the gate 32a of transistor 30a.

Figure 3:
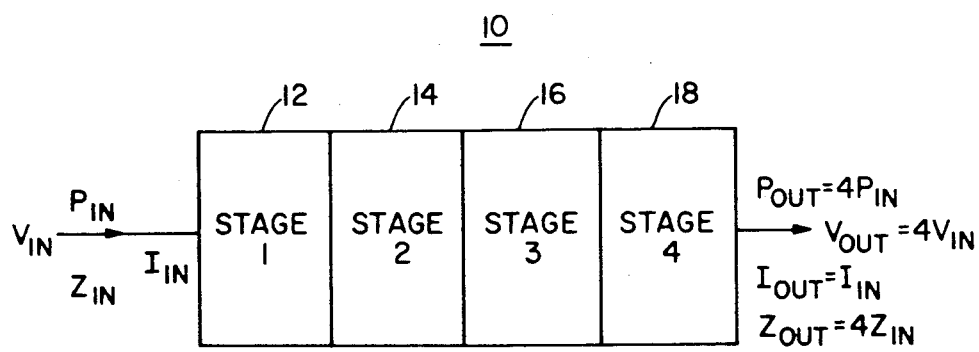
FIG. 3 is a block diagram illustrating the improved power and impedance characteristics of a four-stage internally matched power amplifier according to this invention.

Using a four-stage device 10, FIG. 1, shown in simplified block diagram in FIG. 3, the performance of the power amplifier according to this invention can be seen more clearly. For example, while the input impedance $Z_{in}$ is equal to the impedance of one stage, the output impedance $Z_{out}$ is equal to four times that impedance, or $4Z_{in}$. Similarly, the power out is equal to four times the power in and the voltage out is equal to four times the voltage in, while the current out is equal to the current in.

Figure 4A:
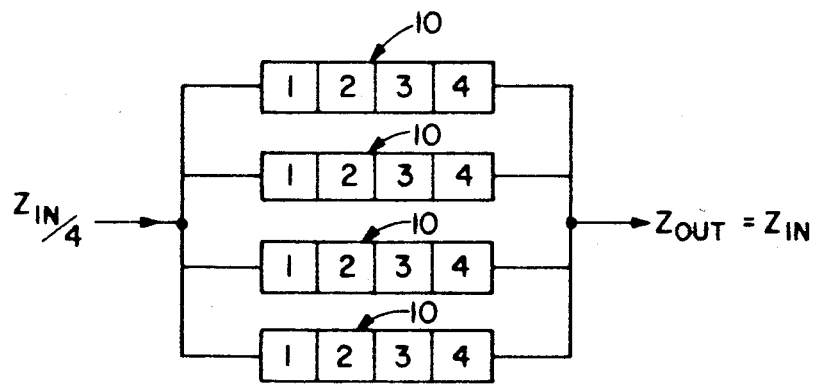
FIG. 4A is a block diagram showing improvements realized even with the parallel configuration of a group of series-connected internally matched power amplifiers according to this invention.
Figure 4B:
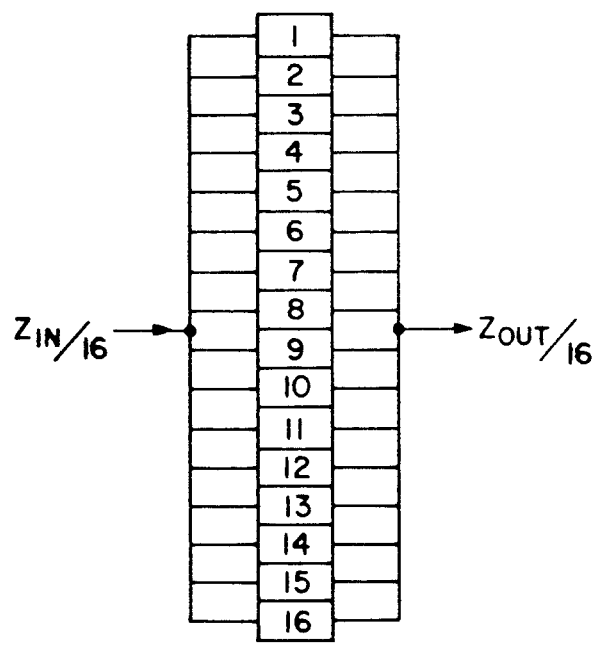
FIG. 4B illustrates the poorer characteristics of conventional paralleled power amplifier configurations.

The improvement afforded by this invention is shown perhaps even more clearly by the comparison of the input and output impedances the circuits in FIGS. 4A and 4B. In FIG. 4A, a four-stage amplifier 10 has been replicated four times and connected in parallel to provide sixteen stages. Now the input impedance to that parallel circuit shown in FIG. 4A is one fourth of $Z_{in}$, whereas the output $Z_{out}$ is equal to $Z_{out}$ of a single transistor. Compare this with a conventional, completely parallel power amplifier with sixteen stages. There the total impedance of the circuit is the input impedance of one stage divided by sixteen, and the output impedance is the output impedance of a single stage divided by sixteen.

A more complete comparison can be seen in the following chart, which compares various parameters for a single cell or stage, end unit cells paralleled and end unit cells "series" connected in accordance with the invention.

CHART I

| Parameter | Unit Cell | n Unit Cells Paralleled | n Unit Cells "series" connected |
|---|---|---|---|
| Periphery | W | nW | nW |
| Operating current | ½ $I_{dss}$ | n/2 $I_{dss}$ | ½ $I_{dss}$ |
| Operating voltage | $V_D$ | $V_D$ | $nV_D$ |
| $C_{in}$ | $C_{gs}$ | $nC_{gs}$ | $C_{gs}$ |
| $R_{out}$ | $R_L$ | $R_L/n$ | $nR_L$ |
| Gain | G | G | nG − (n − 1) |
| $P_{dc}$ | ½ $I_{dss}V_D$ | n/2 $I_{dss}V_D$ | n/2 $I_{dss}V_D$ |
| $P_{RF\ in}$ | $P_O$ | $nP_O$ | $P_O$ |
| $P_{RF\ out}$ | $GP_O$ | $nGP_O$ | $nGP_O$ − (n − 1)$P_O$ |
| $\eta_{power\ added}$ | $\eta_O$ | $\eta_O$ | $\eta_O$ |

A brief inspection of Chart I shows that while the operating current of the system of this invention is the same as that of a unit cell, the parallel configuration would have a current equal to the number of stages divided by two. Perhaps most strikingly the output impedance of a series power amplifier in accordance with this invention is directly proportional to the number of stages, whereas in the parallel configuration it is inversely proportional to the number of stages.

A more practical illustration for a three-stage power amplifier according to this invention using 1μ gate length X-band FETs and assuming a 0.5 W/mm output capability and a 6 dB gain is shown in Chart II.

CHART II

| Parameter | Unit Cell | 3 Unit Cells Paralleled | 3 Unit Cells "series" connected |
|---|---|---|---|
| Periphery | 2 mm | 6 mm | 6 mm |
| Operating current | 0.35 A | 1.05 A | 0.35 A |

CHART II-continued

| Parameter | Unit Cell | 3 Unit Cells Paralleled | 3 Unit Cells "series" connected |
|---|---|---|---|
| Operating voltage | 7 V | 7 V | 21 V |
| $C_{in}$ | 2.25 pF | 6.75 pF | 2.25 pF |
| $R_L$ | 18 Ω | 6 Ω | 54 Ω |
| Gain | 6 dB | 6 dB | 10 dB |
| $P_{in}$ | 0.25 W | 0.75 W | 0.25 W |
| $P_{out}$ | 1 W | 3 W | 2.5 W |
| $\eta_{power\ added}$ | 31% | 31% | 31% |

Thus in this example the power amplifier according to this invention uses one third the current of the parallel configuration with an operating voltage which is three times higher. The output impedance in the power amplifier of this invention is nine times greater than that in the parallel configuration, and the gain is up 4 dB. The input power requirement of the power amplifier of the circuit is one third of that of the parallel configuration.

Although specific features of the invention are shown in some drawings and not others, this is for convenience only as each feature may be combined with any or all of the other features in accordance with the invention.

Other embodiments will occur to those skilled in the art and are within the following claims.

What is claimed is:

1. An internally matched power amplifier comprising:
   an input terminal for receiving an input signal and an output terminal for connection to a d.c. power source;
   a first semiconductor device having its control electrode coupled to said input terminal and its first load electrode connected to a common conductor, said control electrode having a predetermined d.c. bias level and a predetermined signal voltage level relative to said first load electrode;
   a second semiconductor device having its second load electrode coupled to said output terminal;
   transmission means connected in series between the second load electrode of the first device and first load electrode of the second device for establishing an internal impedance match;
   capacitance means coupled between the common conductor and the control electrode of the second device for setting the signal voltage level between the control electrode and first load electrode of the second device to the predetermined signal voltage level of said first device; and
   voltage divider means coupled between the output terminal and the common conductor and connected to the control electrode of the second device for setting the d.c. bias level between the control electrode and first load electrode of the second device to the predetermined d.c. bias level of said first device.

2. The internally matched power amplifier of claim 1 in which said semiconductor devices are transistors.

3. The internally matched power amplifier of claim 2 in which said semiconductor devices are FET transistors, said control electrodes are gates and said first and second load electrodes are source and drain, respectively.

4. The internally matched power amplifier of claim 1 in which said semiconductor devices are identical.

5. The internally matched power amplifier of claim 1 in which said transmission means includes inductance means.

6. The internally matched power amplifier of claim 1 in which said capacitance means includes the internal capacitance of a semiconductor.

7. An internally matched power amplifier comprising:
   an input terminal for receiving an input signal and an output terminal for connection to a d.c. power source;
   an input stage including a semiconductor device having its control electrode coupled to said input terminal and its first load electrode connected to a common conductor for establishing a predetermined d.c. bias level and a predetermined signal voltage level between the control and first load electrodes;
   a plurality of successive output stages each output stage including:
   transmission means for establishing an internal impedance match;
   a semiconductor device with its first load electrode coupled through its associated transmission means to the second load electrode of the previous semiconductor device, with its second load electrode coupled to the first load electrode of the next successive semiconductor device through its associated transmission means, the semiconductor device of the last output stage having its second load electrode connected to said output terminal;
   capacitance means coupled between the control electrode and the common conductor for setting the signal voltage level between the control electrode and first load electrode to the predetermined signal voltage level of the device in the input stage; and
   voltage divider means coupled between the output terminal and common conductor and connected to the control electrode of the device in each output stage for setting the d.c. bias level to the predetermined d.c. bias voltage of the input stage.

8. The internally matched power amplifier of claim 7 in which said semiconductor devices are transistors.

9. The internally matched power amplifier of claim 8 in which said semiconductor devices are FET transistors, said control electrodes are gates and said first and second load electrodes are source and drain, respectively.

10. The internally matched power amplifier of claim 7 in which said semiconductor devices are identical.

11. The internally matched power amplifier of claim 7 in which said transmission means includes inductance means.

12. The internally matched power amplifier of claim 7 in which said capacitance means includes the internal capacitance of a semiconductor.

13. An internally matched power amplifier comprising:
   an input terminal for receiving an input signal and an output terminal for connection to a d.c. power source;
   a series of semiconductor devices;
   transmission means interconnecting the load electrodes of each neighboring pair of semiconductor devices in the series for establishing an internal impedance match;
   the first semiconductor device in the series having its other load electrode coupled to a common conductor and its control electrode coupled to the input terminal and having a predetermined signal voltage level and predetermined d.c. bias level between its control electrode and said other load electrode;
   voltage divider means coupled between the output terminal and common conductor and connected to the control electrode of each of the remaining devices for setting the d.c. bias level to the predetermined d.c. bias voltage of the first device in the series;
   capacitance means coupled between the control electrode and the common conductor of each of said remaining devices in the series for setting the signal voltage level to that predetermined signal voltage level;
   the last device in the series having its other load electrode connected to said output terminal.

14. An internally matched power amplifier comprising:
   an input terminal for receiving an input signal and an output terminal;
   a plurality of semiconductor devices connected with their load electrodes in series;
   transmission means for coupling the load electrodes of neighboring devices in the series and establishing an internal impedance match;
   the last device in the series having its other electrode connected to said output terminal; the first semiconductor device in the series having its control electrode connected to said input terminal and its other load electrode connected to a common conductor, and having a predetermined d.c. bias level and predetermined signal voltage level between its control and said other load electrode;
   first means for setting the control electrode of each device but the first in the series to the predetermined signal voltage level; and
   second means for biasing the control electrode of each device but the first in the series to the predetermined d.c. bias level.

* * * * *